(12) United States Patent
Tsai

(10) Patent No.: US 11,557,626 B2
(45) Date of Patent: Jan. 17, 2023

(54) COMPLEMENTARY METAL-OXIDE-SEMICONDUCTOR IMAGE SENSOR AND METHOD OF MAKING

(71) Applicant: TAIWAN SEMICONDUCTOR MANUFACTURING COMPANY, LTD., Hsinchu (TW)

(72) Inventor: Bo-Tsung Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 30 days.

(21) Appl. No.: 17/212,865

(22) Filed: Mar. 25, 2021

(65) Prior Publication Data

US 2021/0210545 A1 Jul. 8, 2021

Related U.S. Application Data

(60) Continuation of application No. 17/081,609, filed on Oct. 27, 2020, which is a continuation of application No. 16/415,870, filed on May 17, 2019, now Pat. No. 10,854,668, which is a division of application No. 15/718,318, filed on Sep. 28, 2017, now Pat. No. 10,297,636.

(51) Int. Cl.
| | |
|---|---|
| *H01L 27/146* | (2006.01) |
| *H01L 21/266* | (2006.01) |
| *H01L 29/78* | (2006.01) |
| *H01L 21/265* | (2006.01) |

(52) U.S. Cl.
CPC .... *H01L 27/14689* (2013.01); *H01L 27/1461* (2013.01); *H01L 27/14614* (2013.01); *H01L 27/14616* (2013.01); *H01L 21/266* (2013.01); *H01L 21/26513* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 5,466,961 | A | 11/1995 | Kikuchi |
| 7,075,148 | B2 | 7/2006 | Hofmann |
| 7,767,525 | B2 | 8/2010 | Manning |
| 8,338,880 | B2 | 12/2012 | Wu |
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,496,390 | B2 | 11/2016 | Su |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |

(Continued)

*Primary Examiner* — Long Pham
(74) *Attorney, Agent, or Firm* — Hauptman Ham, LLP

(57) ABSTRACT

A pixel includes a workpiece having a protrusion and a bulk, wherein the protrusion extends from an upper surface of the bulk. The pixel further includes a floating diffusion node in the protrusion. The pixel further includes a gate structure over the bulk, wherein a top surface of the gate structure is above a top surface of the floating diffusion node. The pixel further includes a photosensitive device in the bulk. The pixel further includes an isolation well surrounding the photosensitive device.

20 Claims, 11 Drawing Sheets

(56) References Cited

U.S. PATENT DOCUMENTS

| | | |
|---|---|---|
| 9,704,911 B2 | 7/2017 | Oh |
| 2006/0046392 A1 | 3/2006 | Manning |
| 2007/0102756 A1 | 5/2007 | Lojek |
| 2014/0211056 A1 | 7/2014 | Fan |
| 2015/0069500 A1 | 3/2015 | Su |
| 2015/0206956 A1 | 7/2015 | Kim |
| 2016/0150168 A1 | 5/2016 | Oh |

COMPLEMENTARY METAL-OXIDE-SEMICONDUCTOR IMAGE SENSOR AND METHOD OF MAKING

PRIORITY CLAIM

The present application is a continuation of U.S. application Ser. No. 17/081,609, filed Oct. 17, 2020, which is a continuation of U.S. application Ser. No. 16/415,870, filed May 17, 2019, now U.S. Pat. No. 10,854,668, issued Dec. 1, 2020, which is a divisional of U.S. application Ser. No. 15/718,318, filed Sep. 28, 2017, now U.S. Pat. No. 10,297,636, issued May 21, 2019, which are incorporated herein by reference in their entireties.

BACKGROUND

Semiconductor image sensors are used to detect radiation such as visible light. A complementary metal-oxide-semiconductor (CMOS) image sensor (CIS) and charge-coupled device (CCD) are applied in various applications, such as cameras, mobile phones, and laptops for image capturing. The CIS utilizes an array of pixels in a substrate, including transistors and photodiodes to absorb photons received at the substrate and to convert the photons into an electrical charge. Analog signals resulting from the electrical charge are amplified and an analog-to-digital converter converts the amplified signals into digital signals. Afterward, a plurality of processes of color interpolation such as color correction, gamma correction and white balance are performed for image refining or compressing. In comparison with a front-side illumination CIS (FSICIS), a back-side illumination CIS (BSICIS) allows incident light to penetrate from a back side of a substrate, i.e., a side opposite to interconnect structures. In such a way, image sensor operation is improved as the BSICIS captures more photons of an image signal than the FSICIS due to reduced reflection of incident radiation by the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
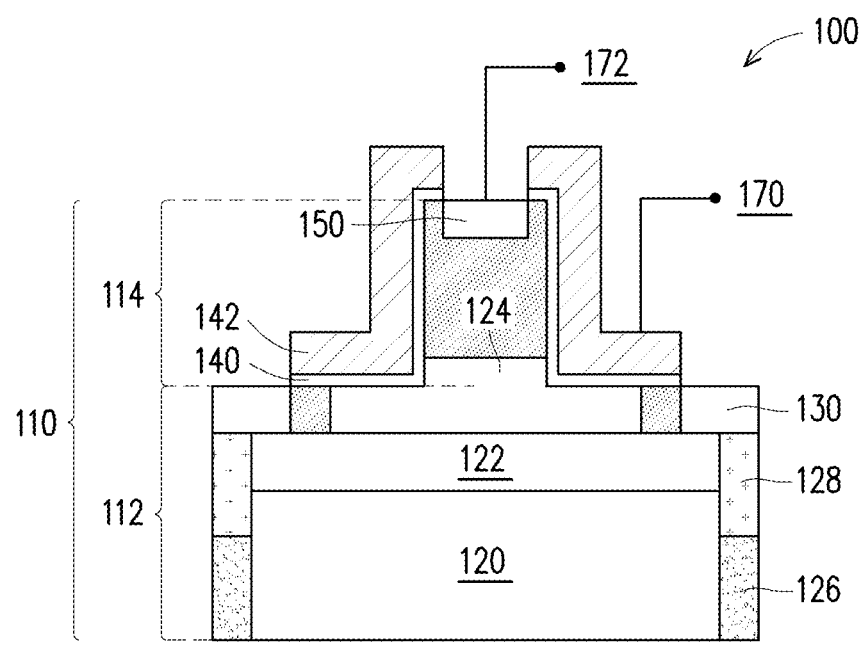
FIG. 1A is a cross-sectional views of a pixel area in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

In a four-transistor (4T) cell, a CMOS image sensor includes a photosensitive device (such as a radiation detector), a transfer gate transistor, a reset transistor, a selection transistor and a source-follower. Photons are accumulated and transferred into carriers when the image sensor is exposed to an incident radiation. Afterward, when the transfer gate transistor is on, the photosensitive device transmits carriers to a floating diffusion node which serves as a source/drain feature of the transfer gate transistor. Next, the reset transistor resets the floating diffusion node by removing carriers and permitting a new set of carriers to be received by the floating diffusion node.

As a size of photosensitive devices has decreased to be smaller in order to reduce pixel pitch, i.e., a distance between neighboring pixels, an array of pixels is closer to a surrounding reference black signal region and/or peripheral circuitry. As a result of the reduced dimensions, a quantum efficiency is reduced due to a smaller fill factor. In some cases, the quantum efficiency is determined as the number of carriers generated by incident photons divided by the number of incident photons in the photosensitive device, and the fill factor is determined as a chip area occupied by the photosensitive device divided by a total chip area of each pixel unit, and the well capacitance is determined by the number of carriers accumulated in the photosensitive device.

In some embodiments, a direction of a channel of the transistor is substantially orthogonal to a top surface of the pixel area. In comparison with other approaches, a tradeoff between a channel length/width of the transistor and the fill factor is reduced or eliminated. Further, in comparison with other approaches, a parasitic capacitance is substantially reduced or avoided because the floating diffusion node is separated from a cell isolation region, resulting in an improved photo transfer curve and image quality. Furthermore, in comparison with other approaches, the image sensor is able to apply global shutter capture because each pixel has an independent floating diffusion node, thereby accelerating signal transfer from the photosensitive device to output circuitry by at least four times. In a global shutter capture, rows and columns of photosensitive devices are concurrently activated when capturing an image.

FIG. 1A is a cross-sectional view of a pixel area 100 in accordance with one or more embodiments. Pixel area 100 includes a workpiece 110, including a bulk 112 and a protrusion 114, a dielectric feature 140 and a conductive feature 142. Conductive feature 142 is coupled to a first node 170. Bulk 112 includes a carrier accumulation region 120, a first doping region 122, a second doping region 124, a deep well region 126, a cell well region 128 and a third doping region 130. Third doping region 130 is spaced apart from second doping region 124. Protrusion 114 includes a protrusion doping region 150. Protrusion doping region 150 is coupled to a second node 172.

Workpiece 110 includes a semiconductor material, such as silicon, germanium, silicon-germanium, silicon-carbide, III-V compounds, organic compounds or another suitable material. In some embodiments, workpiece 110 is a silicon on insulator layer (SOI) substrate or a silicon on sapphire (SOS) substrate. In some embodiments, an insulating layer (not shown) is formed at a bottom surface of workpiece 110. At least one isolation structure (not shown), also referred to as a shallow trench isolation (STI), is in workpiece 110 and is configured to separate pixel areas from each other. In some embodiments, isolation structures are used to separate pixel areas from peripheral circuitry. Protrusion 114 extends from a top surface of bulk 112. In some embodiments, more than one protrusion 114 extends from the top surface of bulk 112. In some embodiments, protrusion 114 extends substantially perpendicularly from the top surface of bulk 112. In some embodiments, protrusion 114 is tilted relative to the top surface of bulk 112. In some embodiments, protrusion 114 includes a same material as bulk 112. Alternatively, protrusion 114 includes a different material from bulk 112.

Dielectric feature 140 is configured to be a gate insulating feature and conductive feature 142 is configured to be a gate electrode in a field effect transistor (FET). Dielectric feature 140 extends from the top surface of bulk 112, along sidewalls of protrusion 114 to a top surface of protrusion 114. Although dielectric feature 140 appears to be discrete elements which are separated from each other in the cross-sectional view of FIG. 1A, in at least one embodiment a single dielectric feature 140 continuously surrounds the sidewalls of protrusion 114. Conductive feature 142 is continuously over dielectric feature 140 so as form a gate-all-around (GAA) structure. In some embodiments, conductive feature 142 has a Z-shaped profile. A central portion of the top surface of protrusion 114 is exposed, i.e., not covered by dielectric feature 140 or conductive feature 142. The exposed portion is doped to form a protrusion doping region 150, which has a same conductivity type as carrier accumulation region 120. In some embodiments where pixel area 100 includes a readout transistor (or referred to a transfer gate transistor) in a 4T CMOS image sensor, second node 172 is a floating diffusion node. In some embodiments where pixel area 100 includes a reset transistor in a 3T CMOS image sensor, second node 172 is coupled to a reference voltage, such as a positive power supply VDD or ground.

Carrier accumulation region 120, also referred to as a collector region, is configured to collect carriers transferred from photons. Carrier accumulation region 120 is adjacent to a surface of bulk 112 opposite protrusion 114.

First doping region 122 is adjacent to carrier accumulation region 120 and is closer to protrusion 114 than carrier accumulation region 120. In some embodiments, first doping region 122 is configured to be a source/drain feature of pixel area 100 and includes a same conductivity type as carrier accumulation region 120. Second doping region 124 is above and adjacent to first doping region 122. In particular, second doping region 124 is at a bottom portion of protrusion 114. That is, the top surface of second doping region 124 is above the top surface of bulk 112. In various embodiments, the top surface of second doping region 124 is substantially parallel to the top surface of bulk 112. In various embodiments, the top surface of the second doping region 124 is below the top surface of bulk 112.

Second doping region 124 extends from and includes a same conductivity type as first doping region 122. In some embodiments, a combination of second doping region 124 and first doping region 122 is configured to be a first conductivity type side of the photosensitive device. In some embodiments, second doping region 124 is further configured to bridge carriers from carrier accumulation region 120 to a channel region of a transistor. In various embodiments, a region occupied by first doping region 122 and second doping region 124 further includes additional doping regions which form a gradient doping profile. In some embodiments, first doping region 122 and second doping region 124 are part of a single doped region having a gradient dopant profile.

Although deep well region 126 appears to be discrete regions which are separated from each other in the cross-sectional view of FIG. 1A, deep well region 126 is along a boundary of bulk 112 and is adjacent to carrier accumulation region 120. Deep well region 126 is configured to help prevent the carriers from flowing to adjacent pixel areas. Deep well region 126 has a different conductivity type from carrier accumulation region 120.

Similar to deep well region 126, cell well region 128, also referred to as a field light doping (FLD), is along the boundary of bulk 112 and is adjacent to both carrier accumulation region 120 and first doping region 122. Because cell well region 128 has a different conductivity type from carrier accumulation region 120, after incident light radiation is absorbed, photoelectrons generated and accumulated in carrier accumulation region 120 are isolated by a combination of cell well region 128 and deep well region 126 so as to help avoid interference between neighboring pixel areas. In some embodiments, cell well region 128 has a doping depth measured from the top surface of bulk 112 in a range from about 100 nanometers (nm) to about 1000 nm. A shallower doping depth increases a risk of introducing noise to adjacent pixel areas, in some instances. If cell well region 128 is too deep and overlaps with deep well region 126, too much dopant over dose will result in an un-balanced P-well implant profile, in some instances. As an amount of over dose increases, a risk of quantum efficiency drop increases, in some instances. In various embodiments, the at least one isolation structure is in cell well region 128.

Similar to deep well region 126, third doping region 130 is along the boundary of bulk 112 and is adjacent to cell well region 128 and first doping region 122. Third doping region 130 is configured to be a second conductivity type side of the photosensitive device. As a result, a combination of third doping region 130 and first doping region 122/second doping region 124 forms opposite conductivity type sides of a p-n junction photo diode. In various embodiments, third doping region 130 is separated from each of the first doping region 122 and second doping region 124 by a spacing to form a p-type, intrinsic and n-type (PIN) photo diode. The PIN photo diode has a thicker depletion region than a PN photo diode, resulting in a stronger electric field to separate electron-hole pairs.

Protrusion doping region 150 is configured to be a source/drain feature of the transistor in pixel area 100. Therefore, protrusion doping region 150 includes a same conductivity type as first doping region 122. As a result, pixel area 100 has a greater fill factor and a greater well capacitance than a pixel area manufactured by other approaches. In at least one embodiment, the well capacitance of pixel area 100 is determined by the number of carriers accumulated in the photosensitive device in pixel area 100.

Figure 1B:
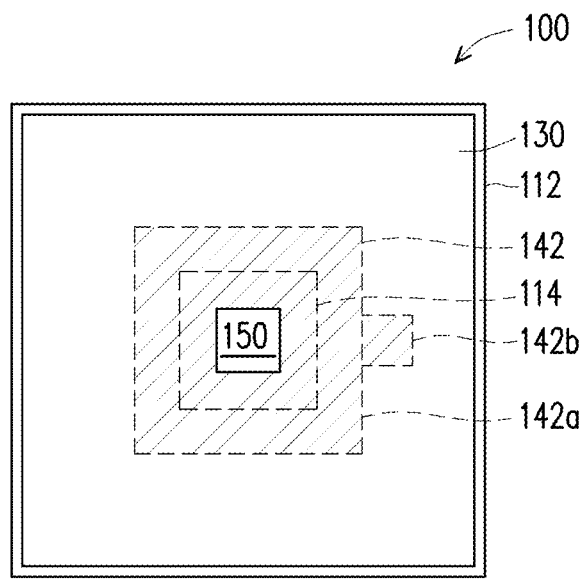
FIGS. 1B-1D are top view of a pixel area in accordance with one or more embodiments.
Figure 1C:
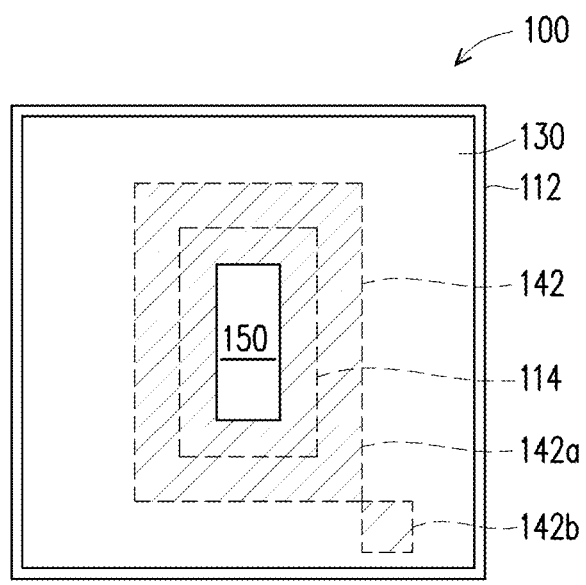
Figure 1D:
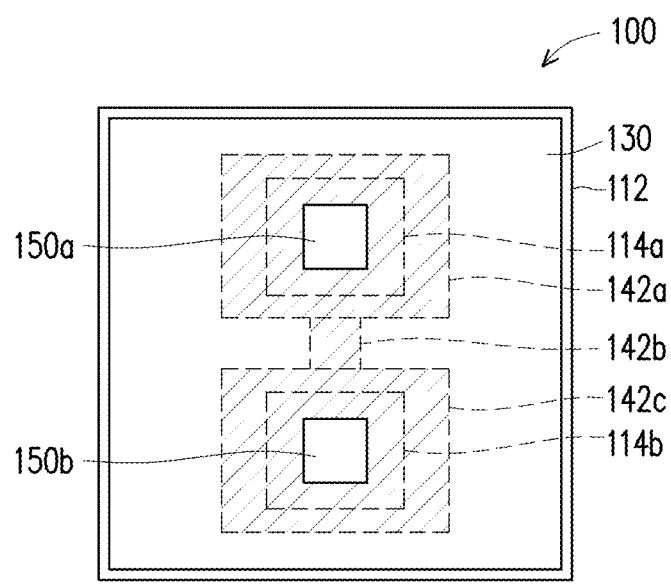

FIGS. 1B-1D are top views of a pixel area 100 in accordance with one or more embodiments. In FIG. 1B, protrusion 114 has a square shape with respect to the top view. In various embodiments, protrusion doping region 150 has a square shape at a central region of protrusion 114. In one or more embodiments, at least one of protrusion 114 or protrusion doping region 150 has another polygonal shape or a circular shape. Further, conductive feature 142 includes a first component 142a surrounding sidewalls of protrusion 114 and a second component 142b used to connect to an external signal. Second component 142b abuts an edge of first component 142a.

In FIG. 1C, protrusion 114 has a rectangular shape elongated along a direction parallel to the top surface of bulk 112. In various embodiments, protrusion doping region 150 has a rectangular shape at the central region of protrusion 114. Second component 142b abuts an edge of first component 142a. In some embodiments, based on various layout design rules, second component 142b abuts an edge of first component 142a.

In FIG. 1D, multiple protrusions 114a-114b extend from the top surface of bulk 112. Second component 142b is coupled to a first component 142a and a third component 142c. One of ordinary skill in the art would understand that the number of protrusions is not limited to two.

Figure 2:
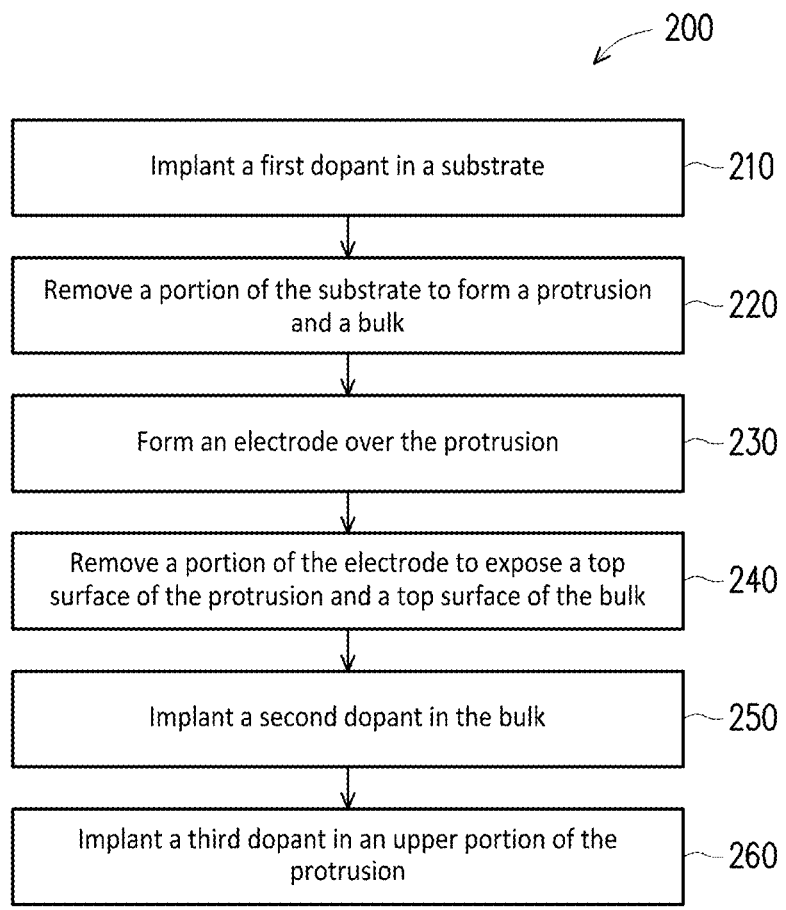
FIG. 2 is a flow chart of a method of fabricating a pixel in accordance with one or more embodiments.

FIG. 2 is a flow chart of a method 200 of fabricating a pixel in accordance with one or more embodiments. One of ordinary skill in the art would understand that additional operations are able to be performed before, during, and/or after method 200 depicted in FIG. 2. Additional details of the fabricating process are provided below with respect to FIGS. 3A-3F, in accordance with some embodiments.

Method 200 includes an operation 210 in which a first dopant, e.g., first dopant 122 in FIG. 1A, is implanted in a first region in a substrate, e.g., workpiece 110 in FIG. 1A. In some embodiments, the first dopant includes an n-type impurity, such as phosphorus, arsenic, antimony or combinations thereof. Before the implantation of the first dopant, the substrate includes a carrier accumulation region which has a same conductivity type as the first dopant. In some embodiments, the carrier accumulation region is formed using a blanket implantation. A dopant concentration of the carrier accumulation region is less than a region of the substrate doped using the first dopant. In various embodiments, one or more n-type dopant is implanted in the substrate after the formation of the first dopant. In some embodiments, the first dopant and the carrier accumulation includes a same impurity. In some embodiments, the first dopant and the carrier accumulation includes different impurities. In some embodiments, the first region is defined by a photomask to occupy a smaller area than the carrier accumulation region.

Method 200 continues with an operation 220 in which a portion of the substrate is removed to form a protrusion, e.g., protrusion 114, and a bulk, e.g., bulk 112. The removal process includes an etch process, such as a wet etching, a dry etching or a combination thereof. In some embodiments where the substrate includes silicon and the removal process includes dry etching, a reactive ion etching (RIE) process is applied with an etchant, such as chlorine gas, hydrogen bromide gas, or oxygen. In some embodiments, an angle between a sidewall of the protrusion and a top surface of the bulk is in a range from about 89 to about 105 degrees. An angle farther from perpendicular to the top surface of the bulk increases a risk of early turn-on of a readout signal, in some instance.

Method 200 continues with an operation 230 in which an electrode, e.g., conductive feature 142 in FIG. 1, is formed over the protrusion. The formation of the electrode includes a deposition process, including physical vapor deposition (PVD), such as sputtering or evaporation, chemical vapor deposition (CVD), such as plasma-enhanced CVD, high density plasma CVD or metalorganic vapor phase epitaxy, atomic layer deposition (ALD), a combination thereof or another suitable method. In some embodiments where the substrate includes silicon and the electrode includes polysilicon, a dielectric feature is formed using thermal oxidation between the protrusion and the electrode. In some embodiments, the formation of the dielectric feature includes a deposition process. In various embodiments where the electrode is in direct contact with the protrusion, the electrode includes a Schottky contact material to form a depletion region in the protrusion.

Method 200 continues with an operation 240 in which a portion of the electrode is removed to expose a region of a top surface of the protrusion and a region of a top surface of the bulk. In order to define an area for a subsequent implantation in the protrusion, the region of the protrusion is exposed while a boundary of the top surface remains covered by the electrode and/or dielectric feature. To define an area for a subsequent implantation in the bulk, a peripheral region of the bulk is exposed while the region remains covered by the electrode and/or dielectric feature. The removal process includes an etch process, such as a wet etching, a dry etching or a combination thereof.

Method 200 continues with an operation 250 in which a second dopant, e.g., third doping region 130 in FIG. 1A, is implanted in the bulk. In some embodiments where the first dopant includes an n-type impurity, the second dopant includes an opposite conductivity type from the first dopant, i.e., p-type impurity, such as boron, boron fluoride, indium or a combination thereof.

Method 200 continues with an operation 260 in which a third dopant, e.g., protrusion doping region 150 in FIG. 1, is implanted in an upper portion of the protrusion. In some embodiments where the first dopant includes an n-type impurity, the third dopant includes an n-type impurity. In some embodiments, the third dopant has a same conductivity type as the first dopant. In some embodiments, the third dopant has a different conductivity type from the first dopant. One of ordinary skill in the art would understand that the conductivity of the first, the second and the third dopant are interchangeable. For example, in some instances, the first dopant and the third dopant include p-type impurities and the second dopant includes an n-type impurity.

In various embodiments, an order of operations in method 200 is modified. For example, in some embodiments, operation 220 is performed before operation 210. As another example, in some embodiments, operation 260 is performed before operation 250. As another example, in some embodiments, in operation 240, the top surface of the protrusion is exposed and followed by operation 260. Afterward, the top surface of the bulk is exposed and followed by operation 250. In various embodiments, additional operations are included in method 200, such as a formation of a deep well, a cell well in a periphery of the bulk. As another example, in some embodiments, a carrier accumulation region is formed in the bulk. As another example, in some embodiments, at least one annealing process follows at least one of the first, the second and the third dopant to form a predetermined diffusion area. As another example, in some embodiments, one or more dopants is implanted immediately precedent or subsequent to the first dopant to form a gradient in the bulk.

FIGS. 3A-3F are cross-sectional views of a pixel area 300 at various stages of manufacturing in accordance with one or more embodiments. Pixel area 300 includes elements similar to pixel area 100 and a last two digits of like elements are the same.

Figure 3A:
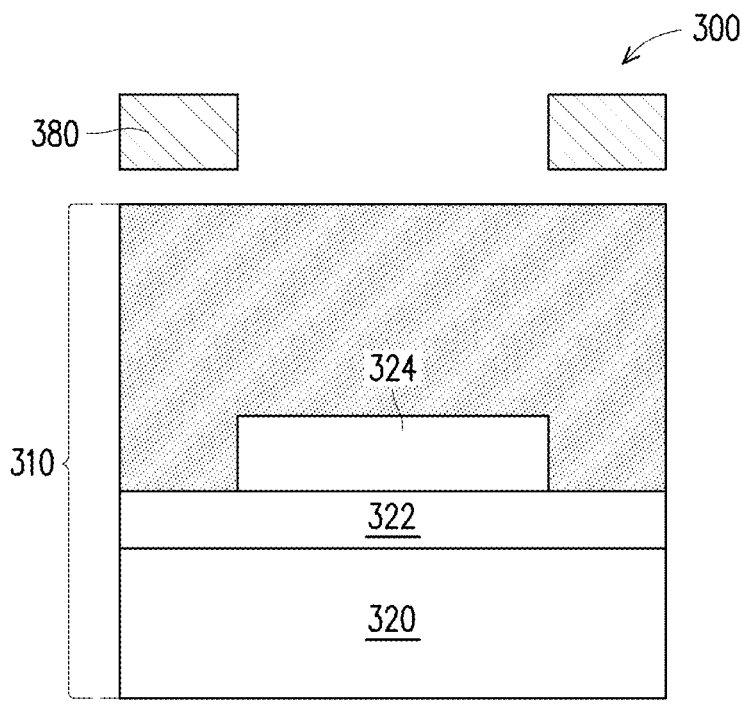
FIGS. 3A-3F are cross-sectional views of a pixel area at various stages of manufacturing in accordance with one or more embodiments.

FIG. 3A is a cross-sectional view of pixel area 300 following operation 210 in accordance with one or more embodiments. First doping region 322 is implanted to serve as first conductivity side of a photosensitive device. In some embodiments, a carrier accumulation region 320, a first doping region 322 and a second doping region 324 which are having a same conductivity type are implanted by order in a workpiece 310. In particular, second doping region 324 is defined by a first mask 380 so that second doping region 324 occupies a smaller area than carrier accumulation region 320 and first doping region 322 with respect to a top view.

In some embodiments, a ratio of a doping concentration of first doping region 322 to that of carrier accumulation region 320 is in a range from about 4:1 to about 6:1. A smaller ratio accumulates insufficient carriers converted from photons, in some instances. A greater ratio makes the doping concentration of first doping region 322 too heavy or the doping concentration of carrier accumulation region 320 too light, in some instances. In some embodiments, second doping region 324 serves as a lightly doped drain (LDD) extension to help prevent hot carrier injunction (HCl) caused from an electrical field between source/drain features. As a result, in order to form a potential gradient for the carriers to transmit, the doping concentration of first doping region 322 to that of second doping region 324 is in a range from about 1.5:1 to about 2.5:1. A greater ratio increases an electrical field between second doping region 324 and a subsequent protrusion doping region 350, in some instances. A smaller ratio increases a risk of point discharge, in some instances. In at least one embodiments, one or more doping regions is formed between first doping region 322 and second doping region 324. In some embodiments, at least one of carrier accumulation region 320, first doping region 322 or second doping region 324 is an epitaxial layer formed in workpiece 310.

Figure 3B:
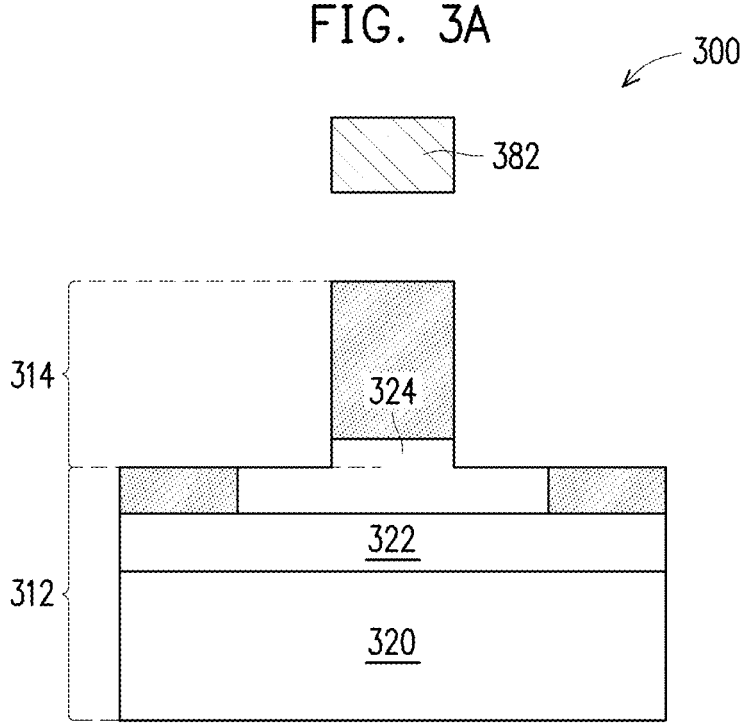

FIG. 3B is a cross-sectional view of pixel area 300 following operation 220 in accordance with one or more embodiments. A second mask 382 is used to define a protrusion 314 over a bulk 312. A top surface of protrusion 314 occupies a smaller area than second doping region 324 with respect to a top view. In some embodiments, more than one protrusion 314 extends from bulk 312. In some embodiments, a thermal or a plasma treatment is performed after the etch process to repair damages caused by the etch process.

Figure 3C:
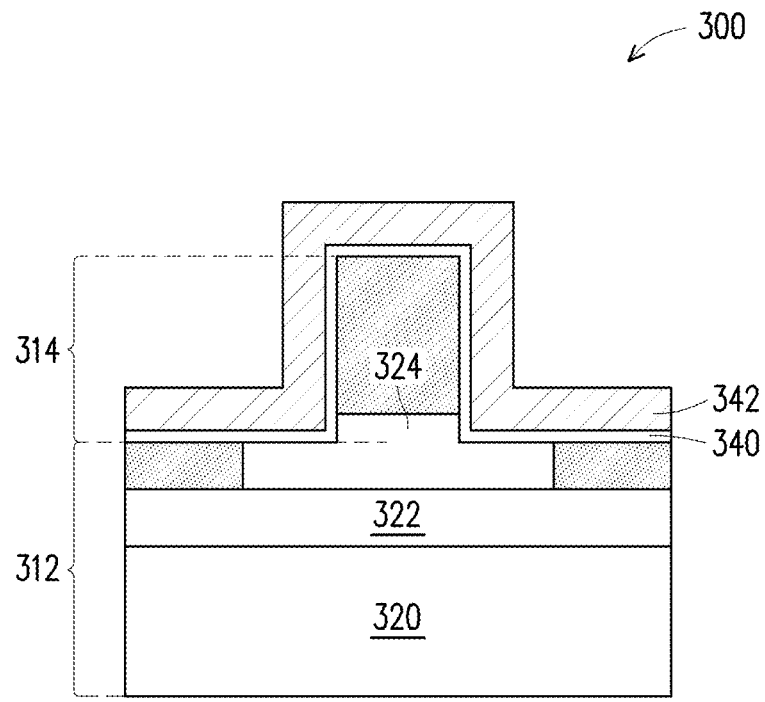

FIG. 3C is a cross-sectional view of pixel area 300 following operation 230 in accordance with one or more embodiments. A dielectric feature 340 is formed over a top surface of bulk 312, sidewalls of protrusion 314 and a top surface of protrusion 314 in a conformal manner. In some embodiments, dielectric feature 340 has a thickness ranging from about 30 Angstroms to about 100 Angstroms. In some embodiments, dielectric feature 340 includes silicon oxide ($SiO_x$) or a high dielectric constant κ (high-κ) dielectric (as compared to silicon dioxide). Next, a conductive feature 342 is formed over dielectric feature 340. In some embodiments, conductive feature 342 includes polysilicon, aluminum, titanium, tantalum, tungsten, nickel, a combination thereof or another appropriate material.

Figure 3D:
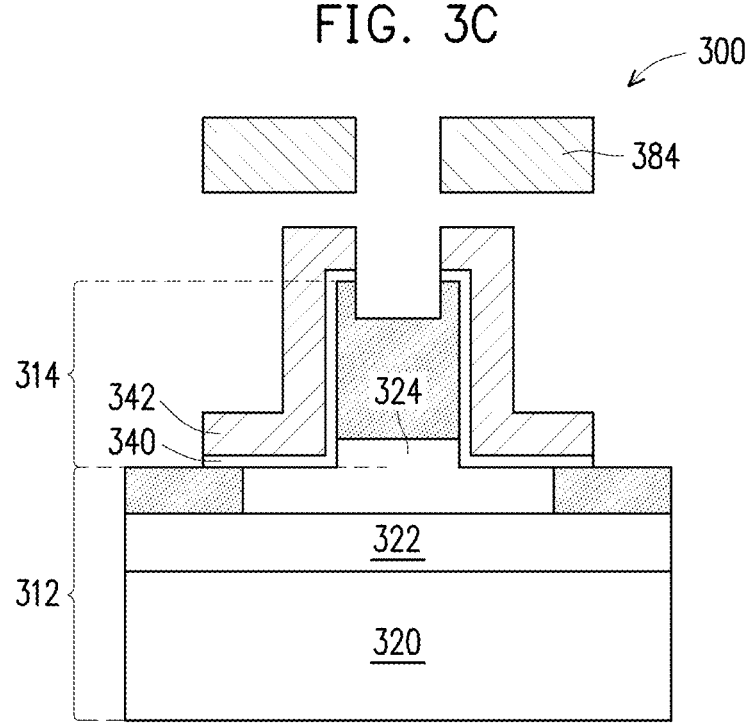

FIG. 3D is a cross-sectional view of pixel area 300 following operation 240 in accordance with one or more embodiments. A third mask 384 is used to expose a central portion of protrusion 314 and a peripheral portion of bulk 312. As a result, the remainder of conductive feature 342 functions as a gate electrode and the remainder of dielectric feature 340 functions as a gate insulator. In some embodiments, both the remainder of conductive feature 342 and the remainder of dielectric feature 340 are formed using a single etch process. In some embodiments, the remainder of conductive feature 342 and the remainder of dielectric feature 340 are formed using sequential etch processes. In order to provide a path for a current flow between source/drain features of the transistor, the remainder of conductive feature 342 and dielectric feature 340 overlap second doping region 324.

Figure 3E:
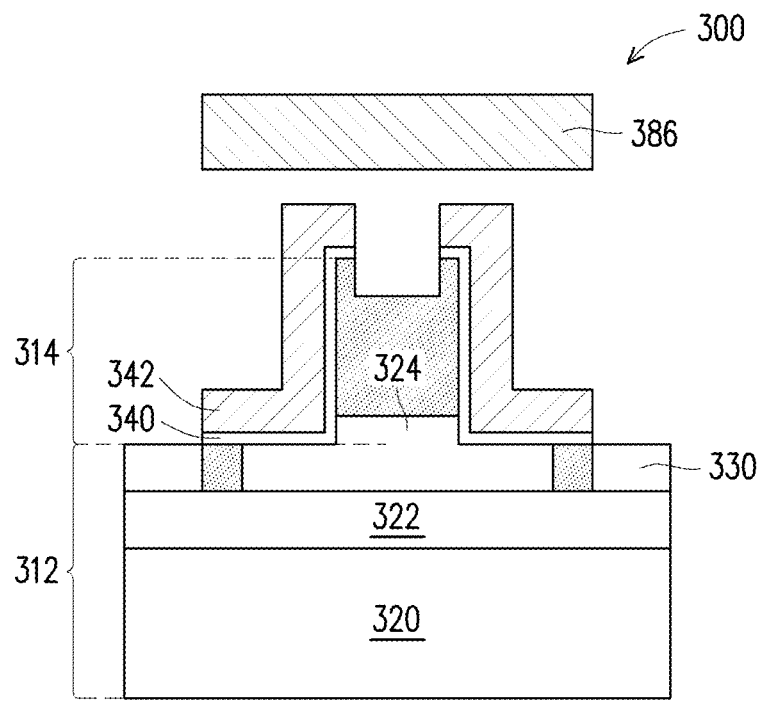

FIG. 3E is a cross-sectional view of pixel area 300 following operation 220 in accordance with one or more embodiments. A fourth mask 386 is used to define an area for a third doping region 330. In some embodiments, third doping region 330 continuously surrounds an upper portion of bulk 312. In some embodiments, a concentration of third doping region 330 is relatively heavier than that of first doping region 322 or second doping region 324.

Figure 3F:
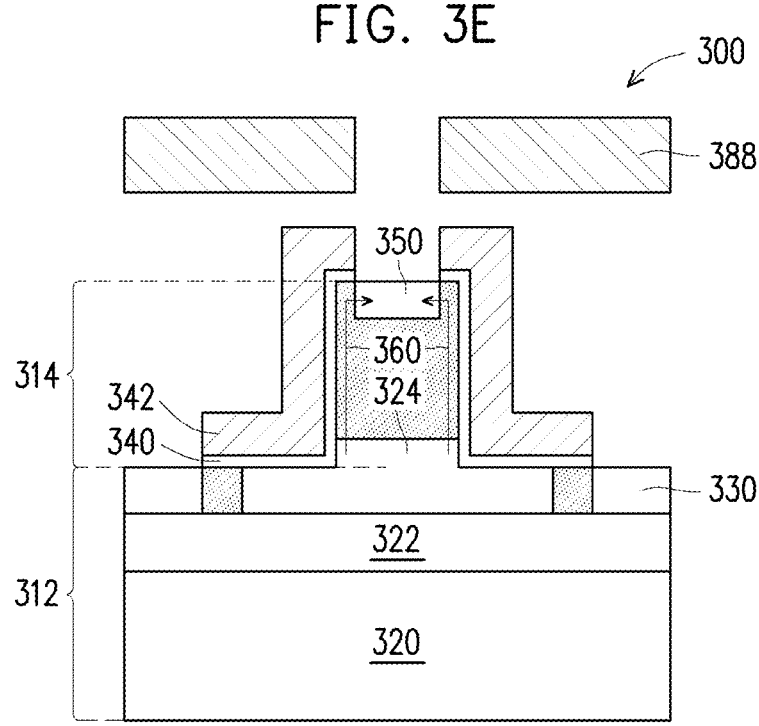

FIG. 3F is a cross-sectional view of pixel area 300 following operation 220 in accordance with one or more embodiments. A fifth mask 388 is used to define a protrusion doping region 350. Because a boundary of the top surface of protrusion 314 is covered by dielectric feature 340 and conductive feature 342, protrusion doping region 350 is separated from sidewalls of protrusion 314. In such a way, protrusion doping region 350 serves as a source/drain feature of the transistor with a current path 360 between protrusion doping region 350 and a photosensitive device formed by first doping region 322 and third doping region 330. In some embodiments, a concentration of protrusion doping region 350 is relatively heavier than that of third doping region 330. In some embodiments, a ratio of a dopant concentration of protrusion doping region 350 to a dopant concentration of second doping region 324 ranges from about 800:1 to about 1100:1. The ratio of dopant concentrations helps to lower protrusion doping region electrical potential to minimize charge spill back. Charge spill back is the result of charges passing along the channel of the transistor in a direction opposite to normal current flow when the transistor is in an OFF state. Charge spill back increases noise in signals transferred across the transistor. The ratio of dopant concentration also helps to reduce contact resistance. In some embodiments, a silicide material is formed on protrusion doping region 350 in order to reduce contact resistance. In some embodiments, the ratio of the dopant concentration of protrusion doping region 350 to the dopant concentration of second doping region 324 is lower when a silicide material is included in protrusion doping region 350 in comparison with non-silicided protrusion doping region 350. In some embodiments, a ratio of a dopant concentration of protrusion doping region 350 to a dopant concentration including a silicide material of second doping region 324 ranges from about 800:1 to about 1100:1.

Figure 4:
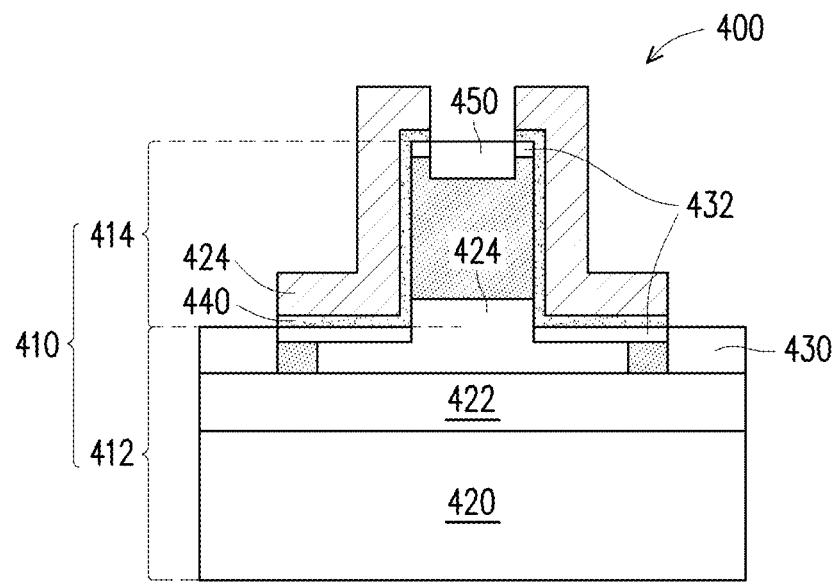
FIG. 4 is a cross-sectional view of a pixel area in accordance with one or more embodiments.

FIG. 4 is a cross-sectional view of a pixel area 400 in accordance with one or more embodiments. Pixel area 400 includes elements similar to pixel area 100 and a last two digits of like elements are the same. In comparison with pixel area 100, pixel area 400 further includes an isolation region 432 which is configured help prevent carrier flows through defects on a top surface of bulk 412. Isolation region 432 is formed in an upper portion of a protrusion 414 and in an upper portion of a bulk 412 using an implantation process after the removal process used to define protrusion 414 and before the formation of a dielectric feature 440. A conductivity of isolation region 432 is different from that of a first doping region 422. In some embodiments, isolation region 432 includes a same impurity as a third doping region 430. For example, in some embodiments where a conductivity of third doping region 430 is p-type, both isolation region 432 and third doping region 430 includes boron. In some embodiments, isolation region 432 includes a different impurity from third doping region 430. Once a light radiation is absorbed, photoelectrons are generated and accumulated in a carrier accumulation region 420, which is surrounded by a combination of isolation region 432 and a FLD and a deep well region (e.g., deep well region 126 and cell well region 128 in FIG. 1). As a result, a dark current which flows from pixel area 400 to adjacent pixel areas is reduced by limiting the photoelectrons in a counter doping region.

Figure 5:
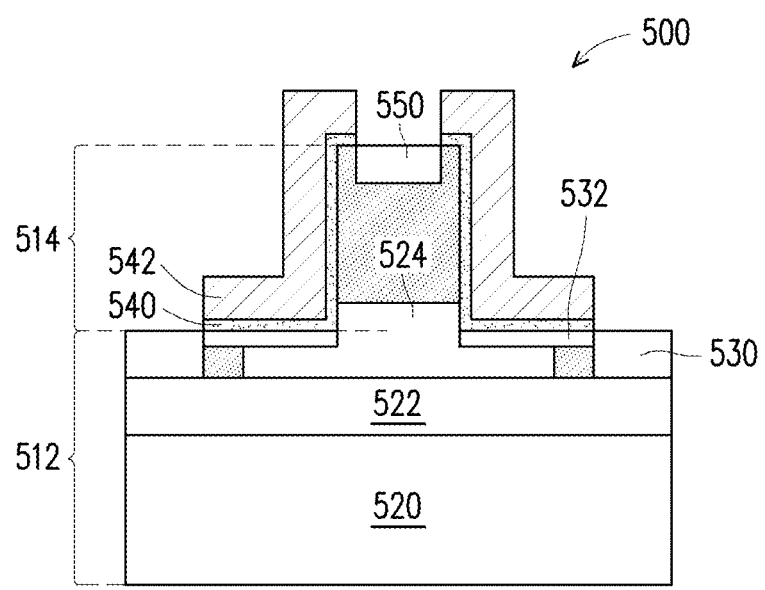
FIG. 5 is a cross-sectional view of a pixel area in accordance with one or more embodiments.

FIG. 5 is a cross-sectional view of a pixel area 500 in accordance with one or more embodiments. Pixel area 500 includes elements similar to pixel area 400 and a last two digits of like elements are the same. In comparison with pixel area 400, an isolation region 532 is selectively implanted in an upper portion of a bulk 512 but not implanted in an upper portion of protrusion 514, which is performed after a formation of a protrusion 514. For example, in some embodiments, isolation region 532 is formed before a photoresist over protrusion 514 is stripped. In some embodiments, the stripping process uses a gaseous plasma to remove the photoresist.

Figure 6:
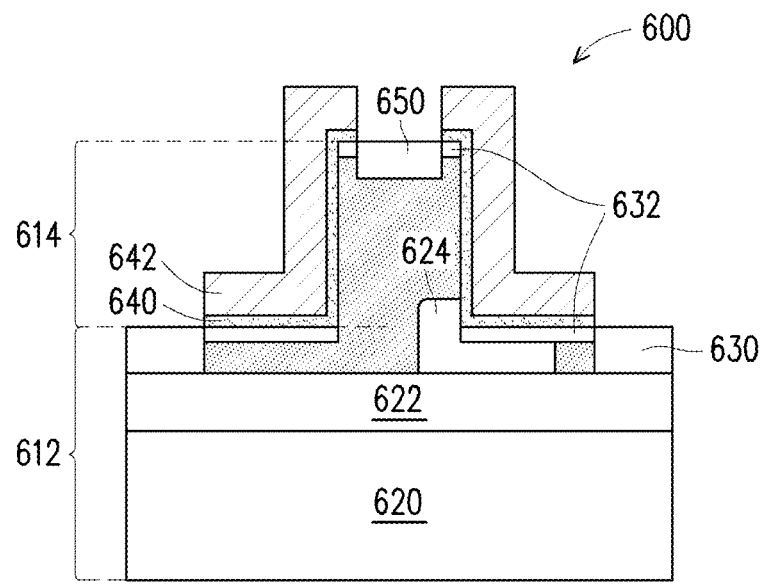
FIG. 6 is a cross-sectional view of a pixel area in accordance with one or more embodiments.

FIG. 6 is a cross-sectional view of a pixel area 600 in accordance with one or more embodiments. Pixel area 600 includes elements similar to pixel area 400 and a last two digits of like elements are the same. In comparison with pixel area 400, a second doping region 624 is offset from a center of a first doping region 622. Therefore, second doping region 624 merely overlaps a part of protrusion 614. In at least one embodiment, pixel area 600 is free of an isolation region 632. In comparison with pixel area 400, an area which is not occupied by second doping region 624 provides a conductive path to ground.

Figure 7:
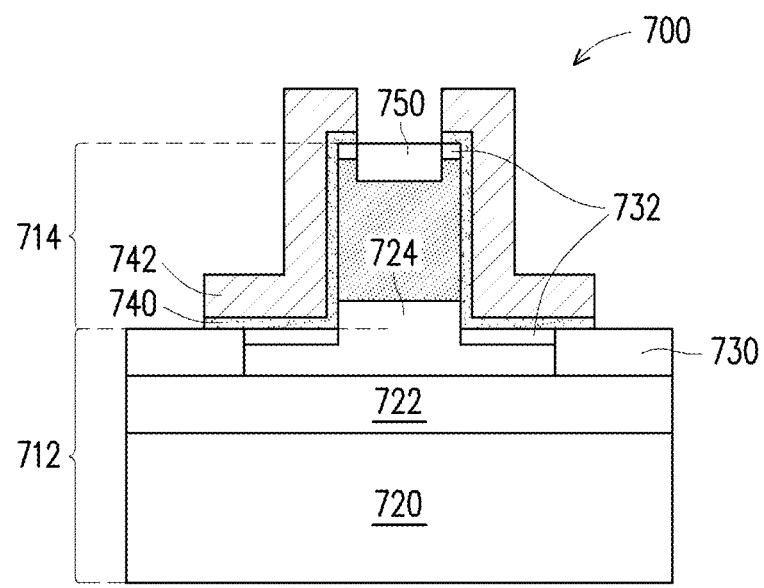
FIG. 7 is a cross-sectional view of a pixel area in accordance with one or more embodiments.

FIG. 7 is a cross-sectional view of a pixel area 700 in accordance with one or more embodiments. Pixel area 700 includes elements similar to pixel area 400 and a last two digits of like elements are the same. In comparison with pixel area 400, a third doping region 730 extends to an edge of a second doping region 724, resulting in a greater area of a photosensitive device, which permits greater carrier accumulation. In at least one embodiment, pixel area 700 is free of an isolation region 732.

Figure 8:
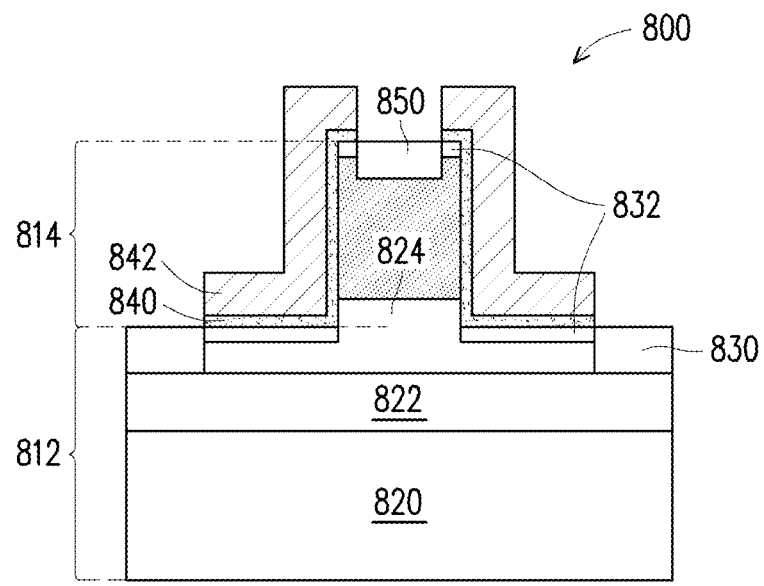
FIG. 8 is a cross-sectional view of a pixel area in accordance with one or more embodiments.

FIG. 8 is a cross-sectional view of a pixel area 800 in accordance with one or more embodiments. Pixel area 800 includes elements similar to pixel area 400 and a last two digits of like elements are the same. In comparison with pixel area 400, a second doping region 824 extends to an edge of a third doping region 830. In at least one embodiment, pixel area 800 is free of an isolation region 832.

Figure 9:
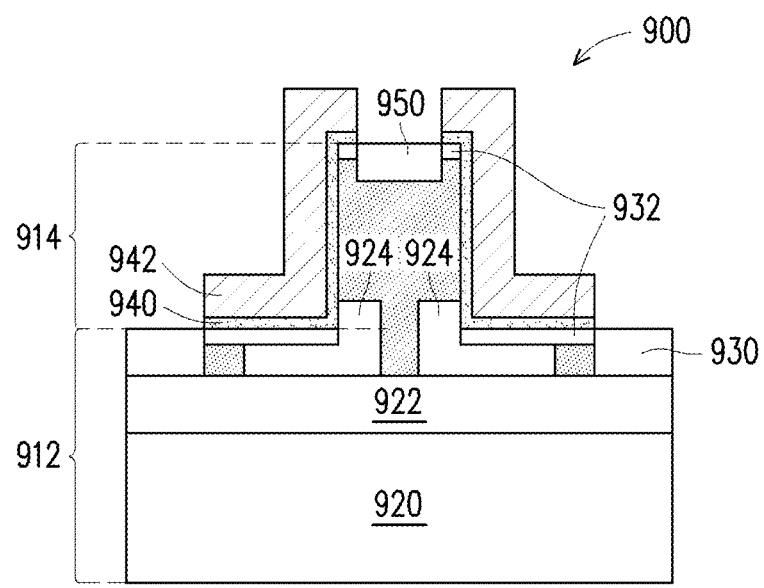
FIG. 9 is a cross-sectional view of a pixel area in accordance with one or more embodiments.

FIG. 9 is a cross-sectional view of a pixel area 900 in accordance with one or more embodiments. Pixel area 900 includes elements similar to pixel area 400 and a last two digits of like elements are the same. In comparison with pixel area 400, a second doping region 924 has an L-shaped profile. Although second doping region 924 appears to be discrete regions which are separated from each other, second doping region 924 is along and surrounds a boundary of protrusion 924. As a result, a central portion of protrusion 914 is second of third doping region 924. In at least one embodiment, pixel area 900 is free of an isolation region 932. In at least one embodiment, a third doping region 930 extends to be adjacent to third doping region 924.

Figure 10:
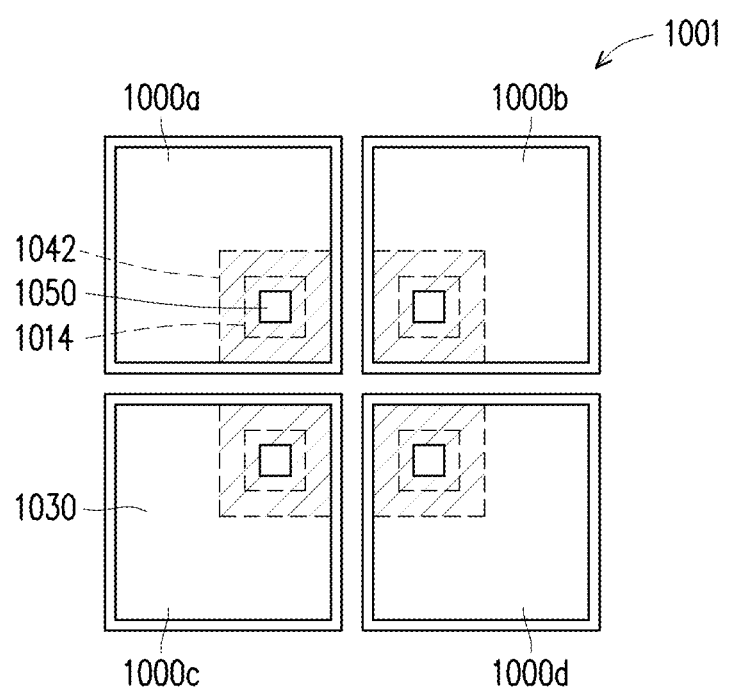
FIG. 10 is a top view of an active pixel sensor in accordance with one or more embodiments.

FIG. 10 is a top view of an active pixel sensor 1001 in accordance with one or more embodiments. Active pixel sensor 1001 includes elements similar to pixel area 100 and a last two digits of like elements are the same. Active pixel sensor 1001 includes multiple pixel areas 1000a-d in a 2×2 (i.e., 2 rows and 2 columns) array, which are electrically isolated from each other. In some embodiments in a 4T image sensor, active pixel sensor 1001 further includes a reset transistor, a select transistor and a source follower (not shown). In some embodiments, each of pixel area 100a-d corresponds to a pixel of active pixel sensor 1001, which represents a minimum area where a photon incident on active pixel sensor 1001 is localized. In some embodiments, each protrusion 1014 is arranged at a corner of pixel areas 1000a-d to have a more flexible wiring displacement in comparison with other approaches. In some embodiments, at least one protrusion 1014 is arranged away from a corner of pixel areas 1000a-d. Adjusting the location of protrusions 1014 helps to increase flexible wiring displacement in comparison with other approaches.

It is understood that each of pixel area 100-900 and active pixel sensor 1001 undergoes further fabrication process flow to form various features, such as a peripheral circuitry, for example, an image signal processing (ISP) circuit, a color filter, a microlens or the like.

An aspect of this description relates to a pixel. The pixel includes a workpiece having a protrusion and a bulk, wherein the protrusion extends from an upper surface of the bulk. The pixel further includes a floating diffusion node in the protrusion. The pixel further includes a gate structure over the bulk, wherein a top surface of the gate structure is above a top surface of the floating diffusion node. The pixel further includes a photosensitive device in the bulk. The pixel further includes an isolation well surrounding the photosensitive device. In some embodiments, the floating diffusion node is electrically connected to a reference voltage. In some embodiments, the gate structure includes a gate dielectric; and a gate electrode over the gate dielectric. In some embodiments, the protrusion and the bulk include a same material. In some embodiments, the photosensitive device includes a source/drain (S/D) region in the bulk. In some embodiments, the S/D region has a gradient dopant profile. In some embodiments, the pixel further includes a deep well in the bulk. In some embodiments, the deep well is configured to limit a dark current from the photosensitive device.

An aspect of this description relates to a pixel. The pixel includes a workpiece having a protrusion and a bulk, wherein the protrusion extends from an upper surface of the bulk. The pixel further includes a floating diffusion node in the protrusion. The pixel further includes a gate structure, wherein a top surface of the gate structure is above a top surface of the floating diffusion node. The pixel further includes a photosensitive device in the bulk. The pixel further includes an isolation well surrounding the photosensitive device. In some embodiments, the gate structure includes a conductive feature in direct contact with the protrusion. In some embodiments, the pixel further includes a deep well in the bulk. In some embodiments, the photosensitive device has a first dopant type, and the deep well has a second dopant type opposite the first dopant type. In some embodiments, the pixel further includes a doped region having a top surface coplanar with a top surface of the bulk. In some embodiments, the photosensitive device has a first dopant type, and the doped region has a second dopant type opposite the first dopant type. In some embodiments, a portion of the bulk is between the photosensitive device and the doped region.

An aspect of this description relates to a method of fabricating a pixel. The method includes forming a photosensitive device in a substrate. The method further includes processing the substrate to define a protrusion and a bulk, wherein the protrusion extends from an upper surface of the bulk, and the photosensitive device is in the bulk. The method further includes forming an isolation well surrounding the photosensitive device. The method further includes forming a gate structure. The method further includes forming a floating diffusion node in the protrusion, wherein a top-most surface of the gate structure is above a top-most surface of the floating diffusion node. In some embodiments, forming the photosensitive device includes implanting dopants into the substrate. In some embodiments, forming the floating diffusion node includes implanting dopants into the protrusion. In some embodiments, forming the gate structure includes forming the gate structure over the bulk. In some embodiments, the method further includes forming a deep well in the substrate, wherein the deep well has an opposite dopant type from the photosensitive device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel, comprising:
   a workpiece having a protrusion and a bulk, wherein the protrusion extends from an upper surface of the bulk;
   a floating diffusion node in the protrusion;
   a gate structure over the bulk, wherein a top surface of the gate structure is above a top surface of the floating diffusion node;
   a photosensitive device in the bulk; and
   an isolation well surrounding the photosensitive device.

2. The pixel of claim 1, wherein the floating diffusion node is electrically connected to a reference voltage.

3. The pixel of claim 1, wherein the gate structure comprises:
   a gate dielectric; and
   a gate electrode over the gate dielectric.

4. The pixel of claim 1, wherein the protrusion and the bulk comprise a same material.

5. The pixel of claim 1, wherein the photosensitive device comprises a source/drain (S/D) region in the bulk.

6. The pixel of claim 5, wherein the S/D region has a gradient dopant profile.

7. The pixel of claim 1, further comprising a deep well in the bulk.

8. The pixel of claim 7, wherein the deep well is configured to limit a dark current from the photosensitive device.

9. A pixel, comprising:
   a workpiece having a protrusion and a bulk, wherein the protrusion extends from an upper surface of the bulk;
   a floating diffusion node in the protrusion;
   a gate structure, wherein a top surface of the gate structure is above a top surface of the floating diffusion node;
   a photosensitive device in the bulk; and
   an isolation well surrounding the photosensitive device.

10. The pixel of claim 9, wherein the gate structure comprises a conductive feature in direct contact with the protrusion.

11. The pixel of claim 9, further comprising a deep well in the bulk.

12. The pixel of claim 11, wherein the photosensitive device has a first dopant type, and the deep well has a second dopant type opposite the first dopant type.

13. The pixel of claim 9, further comprising a doped region having a top surface coplanar with a top surface of the bulk.

14. The pixel of claim 13, wherein the photosensitive device has a first dopant type, and the doped region has a second dopant type opposite the first dopant type.

15. The pixel of claim 14, wherein a portion of the bulk is between the photosensitive device and the doped region.

16. A pixel area comprising:
   a workpiece having a bulk and at least one protrusion, wherein each of the at least one protrusion extends from an upper surface of the bulk;
   a floating diffusion node in each of the at least one protrusion;
   a gate structure extending across each of the at least one protrusion, wherein a top surface of the gate structure is above a top surface of the floating diffusion node, and the gate structure comprises a second component configured to receive an external signal;
   a photosensitive device in the bulk; and
   an isolation well surrounding the photosensitive device.

17. The pixel area of claim 16, wherein the at least one protrusion comprises a first protrusion and a second protrusion.

18. The pixel area of claim 16, wherein the isolation well comprises a plurality of doped regions.

19. The pixel area of claim 18, wherein the plurality of doped regions comprises:
   a first doped region; and
   a second doped region over the first doped region.

20. The pixel area of claim 19, wherein a depth of the first doped regions ranges from about 100 nanometers (nm) to about 1,000 nm.

* * * * *